United States Patent
Cargo et al.

[11] Patent Number: 6,110,831
[45] Date of Patent: Aug. 29, 2000

[54] METHOD OF MECHANICAL POLISHING

[75] Inventors: James Thomas Cargo, Bethlehem, Pa.; Ronald James Alexander Holmes, Kissimmee, Fla.; Ruichen Liu, Warren, N.J.; Alvaro Maury, Orlando, Fla.

[73] Assignee: Lucent Technologies Inc., Murray Hill, N.J.

[21] Appl. No.: 08/923,316

[22] Filed: Sep. 4, 1997

[51] Int. Cl.[7] .................................................. H01L 21/465
[52] U.S. Cl. ........................................................... 438/692
[58] Field of Search ................................... 438/691, 692, 438/693, 5, 14; 215/88

[56] References Cited

U.S. PATENT DOCUMENTS

| | | | |
|---|---|---|---|
| 5,321,304 | 6/1994 | Rostoker | 257/621 |
| 5,668,063 | 9/1997 | Fry et al. | 438/692 |
| 5,705,435 | 1/1998 | Chen | 438/692 |
| 5,795,495 | 8/1998 | Meikle | 216/88 |
| 5,833,846 | 11/1998 | Tananbe et al. | 210/202 |
| 5,836,805 | 11/1998 | Obeng | 451/36 |

Primary Examiner—Benjamin Utech
Assistant Examiner—Duy-Vu Deo
Attorney, Agent, or Firm—Dickstein Shapiro Morin & Oshinsky LLP

[57] ABSTRACT

A method of manufacturing integrated circuits utilizing chemical mechanical polishing (CMP) is disclosed. A dielectric layer, illustratively, having a dopant, dye, etc. termed a "marker layer" is formed upon a wafer having partially fabricated integrated circuits thereon. An undoped, undyed layer is deposited upon the marker layer. The undoped or undyed layer is polished and the waste slurry is monitored until a signal indicating the exposure of the signal layer is obtained. Analysis of the signal provides an indication of when the CMP process should be terminated.

16 Claims, 5 Drawing Sheets

METHOD OF MECHANICAL POLISHING

TECHNICAL FIELD

This invention relates generally to methods for the manufacture of integrated circuits, in general, and more particularly, to methods of forming planarized dielectrics in such integrated circuits.

BACKGROUND OF THE INVENTION

Many modern integrated circuits include several layers of conductive wiring (often termed "runners") which are surrounded and covered by dielectrics, illustratively formed from silicon dioxide. The presence of gates and field oxides, together with the conformal properties of deposited silicon dioxide, tend to make dielectrics very bumpy or uneven. The unevenness of dielectrics makes the formation of additional levels of reliable conductors difficult.

Consequently, it is desired to planarize or smooth dielectric layer prior to further processing such as pattern replication followed by conductor definition. One method for planarizing upper level dielectrics is chemical-mechanical polishing (CMP). CMP is becoming a popular technique for the planarization of interlevel dielectric layers due to the high degree of global planarity that CMP provides. During CMP processing, the wafer, having partially fabricated integrated circuits covered by a thick dielectric, is polished upon a polishing wheel. The resulting upper surface of the interlevel dielectric is highly planar and provides a suitable base or substrate upon which further processing, such as the formation of layers of conductors or metallization may be performed.

However, those concerned with the development of CMP techniques have found that it is difficult to determine when to stop the grinding or polishing of the dielectric. In typical present day applications, it is desired to leave around 0.8 microns of silicon dioxide over the highest conductor after polishing. Usually, the wafer is polished for an initial period of time. Then the wafer is removed from the polishing wheel and the thickness of the oxide is measured. If needed, further polishing is performed for an additional period of time (and, if needed, the process is repeated) until the desired thickness of silicon dioxide is achieved. The polishing rate of the silicon dioxide layer depends upon a large number of factors and the polishing rate is somewhat variable. This variability of the polishing rate complicates the problem of obtaining a layer having a consistent thickness of silicon dioxide on top of the conductor.

SUMMARY OF THE INVENTION

Illustratively, these concerns are addressed by the present invention which includes forming a material layer overlying a substrate having devices formed therein, the material layer having a marker material therein;

polishing at least a portion of said material layer thereby removing some marker material;

measuring the removed marker material;

terminating the polishing after i) the amount of removed marker material reaches a predetermined quantity or ii) the rate of removal of the marker material reaches a predetermined quantity.

DETAILED DESCRIPTION

Figure 1:
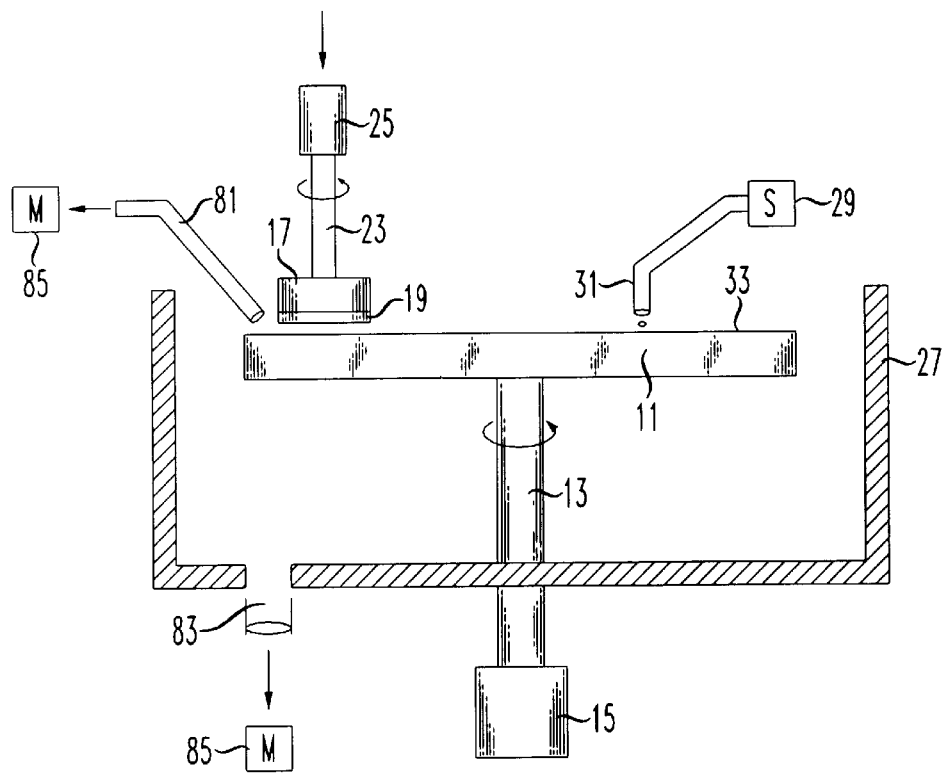
FIG. 1 is a partially perspective, partially cross-sectional view of a typical CMP apparatus in accordance with a illustrative embodiment of the present invention.

FIG. 1 illustrates an apparatus suitable for performing CMP according to an illustrative embodiment of the present invention. Reference numeral 11 denotes a platen which may illustratively, be covered with a pad, typically made from polyurethane, although other suitable materials will suffice. Platen 11 is driven via shaft 13 by motor 15. Reference numeral 17 denotes a carrier which holds wafer 19. Wafer 19 has partially-fabricated integrated circuits formed upon surface 21. Details of the partially fabricated integrated circuits will be discussed below in connection with FIGS. 2–10. Carrier 17 is driven via shaft 23 by motor 25. Platen 11 is generally enclosed within tub 27. A slurry, typically consisting of silicon particles in deionized water is dripped from reservoir 29 via tube 31 onto upper surface 33 of platen 11. When surface 21 of wafer 19 is brought into contact with upper surface 33 of platen 11, surface 21 of wafer 19 is polished or planarized.

Figure 2:
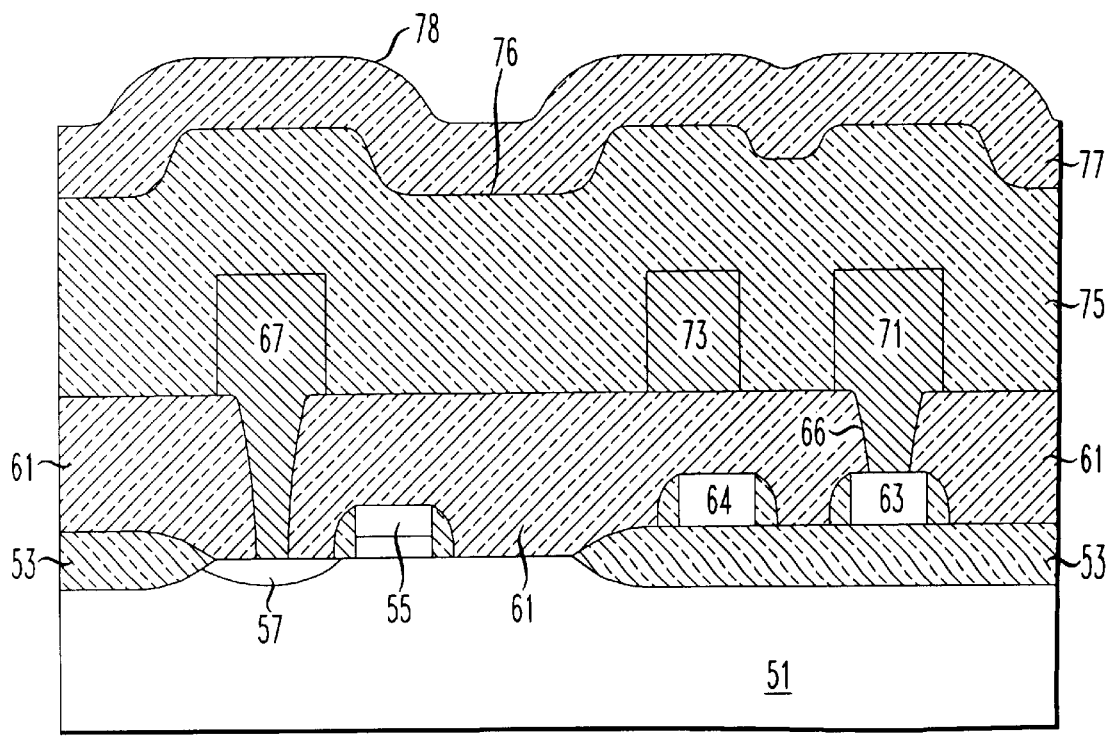
FIGS. 2, 5, and 8 are cross sectional diagrams of partially fabricated integrated circuits processed according to an illustrative embodiment of the present invention.

FIG. 2 is an illustrative cross section of a portion of wafer 19. Shown in FIG. 2 are well known components of a typical MOSFET. However, it will be apparent to those of skill in the art that the invention is applicable to bipolar, BICMOS, and other integrated circuit technologies including laser/flat panel displays or micromachining. Included in FIG. 2 are: substrate 51; gate 55; source/drain 57; field oxide 53; runners 63 and 64; and metallic conductors 67, 71, and 73. Dielectric 61, typically formed from the decomposition of a precursor gas, covers gate 55 and runners 63 and 64. Dielectric 61 may be illustratively a form of silicon dioxide formed from a chemical precursor such as TEOS. In some applications, dielectric 61 may be a bi-layer dielectric. The lower portion of the bi-layer 61 may be an undoped form of silicon dioxide, while the upper portion of the bi-layer 61 may be doped with phosphorus and/or boron. Illustratively, the thickness of dielectric 61 may be: 1 to 1.5 $\mu$m. Dielectric 61 is illustrated as comparatively planar, although it need not be so. Metallization 67, 73, and 71 may illustratively include multiple layers of conductive material, perhaps a sandwich of titanium, titanium nitride, and aluminum, possibly doped with silicon or copper or possibly copper alone. Windows 67 and 66 have been created in dielectric to expose source/drain 57 and runner 63 respectively.

Dielectric 75 is formed over dielectric 61. Dielectric 75 covers the upper portion of conductor 67, 73, and 71. The upper surface 76 of dielectric 75 exhibits an irregular or bumpy topography. Dielectric 75 may illustratively be an oxide of silicon, perhaps formed by decomposition of TEOS. Illustratively, dielectric 75 is undoped.

Dielectric 77 is formed on top and contacting dielectric 75. Dielectric 77 must in general, be chemically, physically or otherwise distinguishable from dielectric 75. Illustratively, dielectric 77 may be an oxide of silicon, perhaps formed from TEOS, and doped with boron, illustratively 2–3% by weight. Other dopants such as phosphorus may be used. Such dopants or other materials may be termed "markers". (Alternatively dielectric 77 may contain a detectable organic or fluorescent dye). Upper surface 78 of dielectric 77 is not smooth, i.e. it has a bumpy topography. The total thickness of dielectric layers 75 & 77 is illustratively 1.6 μm; approximately 0.80–0.85 μm is found suitable for dielectric 75.

During CMP, the upper surface 78 of dielectric 77 contacts the upper surface 33 of platen 11 depicted in FIG. 1. During polishing, the waste slurry is monitored with a high sensitivity chemical sensor. The chemical sensor is designed to detect the appearance of whatever dopant or dye has been incorporated into layer 77. Illustratively, the waste slurry may be collected from tube 83 in the bottom basket 27. If, for example, layer 77 is doped with boron, the waste slurry may be analyzed by a detector 85, illustratively an inductively coupled plasma (ICP) mass spectrometer. Modern ICP mass spectrometers are well equipped to detect parts per trillion of dopants such as boron in solution.

Alternatively, waste slurry may be collected or sucked up by tube 81 which is positioned near the interface between upper surface 21 of wafer 19 and upper surface 33 of platen 11 and then analyzed by an ICP mass spectrometer.

Figure 3:
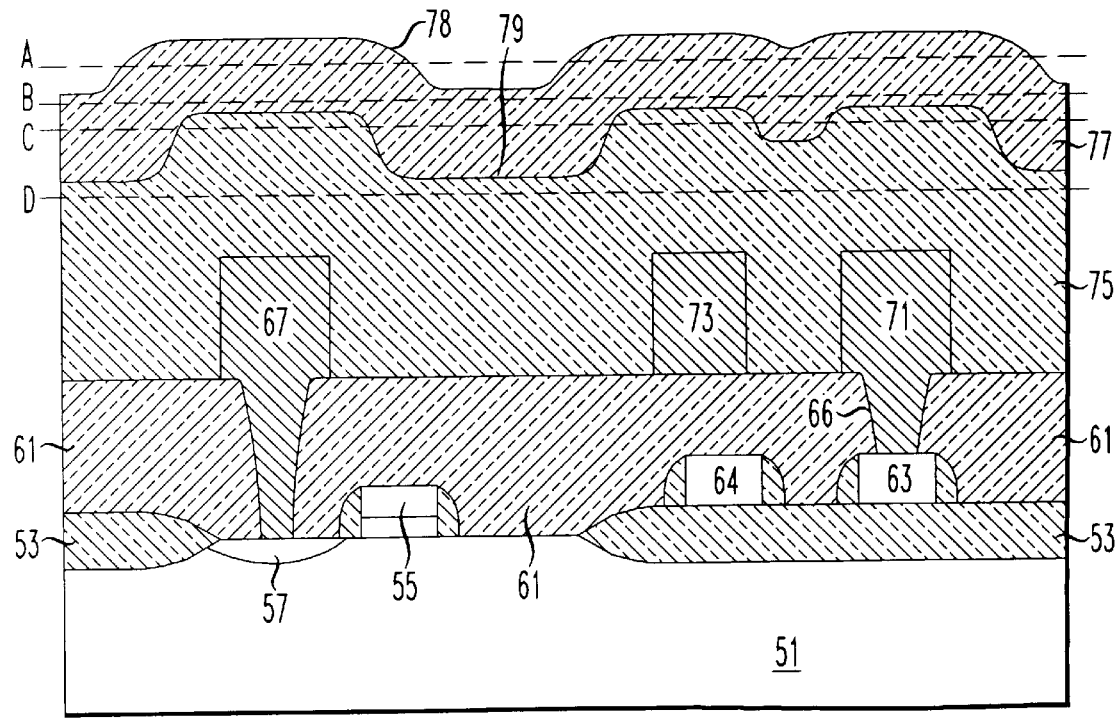
FIGS. 3, 6 and 9 are diagrams of partial cross sections of partially integrated circuits showing various illustrative embodiments of the present invention.
Figure 4:
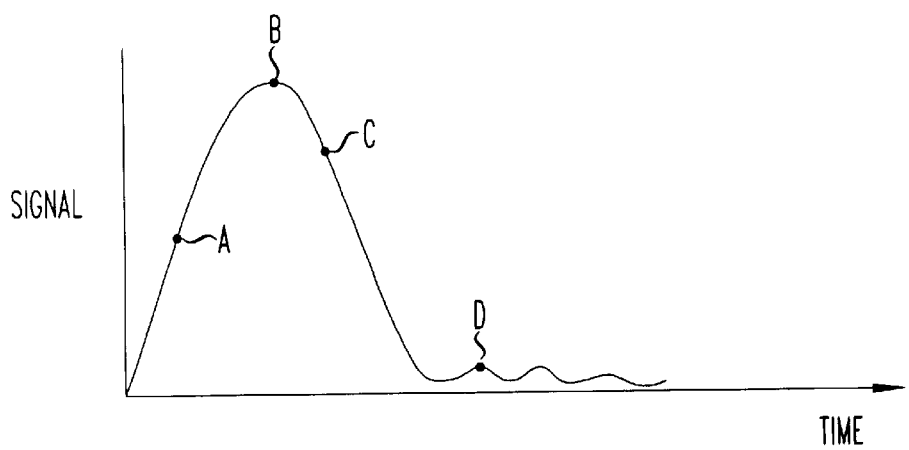
FIGS. 4, 7 and 10 are graphs of signal vs. time useful in understanding the embodiments illustrated in FIGS. 2, 5, and 8.

FIG. 3 is a diagram which corresponds to FIG. 2, with corresponding elements having corresponding reference numerals. Reference lines A, B, C, and D indicate levels to which dielectric 77 may be polished. The graph of FIG. 4 illustrates signal strengths observed at detector 85 as a function of time. The signal strength is proportional to, illustratively, the boron or other dopant concentration (or dye concentration) present in the waste slurry. If other markers are used, radiation, electrical properties, light emission or fluorescence may be measured.

Thus, for example, when the upper surface 78 of dielectric 77 is polished to the level indicated by reference line A, the signal, illustrated in FIG. 4, observed at detector 85, is denoted by reference letter A along the rising portion of the curve. It will be seen from an examination of FIG. 3, that polishing of dielectric 77 to the level of reference line A removes the upper-most portion of dielectric 77 but does not provide complete planarization because, for example, valleys such as that denoted reference numeral 79 still remain. One may, however, terminate polishing at this point if complete planarization is not desired.

As dielectric 77 is polished further to a level denoted by reference line B, a maximum signal strength denoted by letter B in FIG. 4 is obtained. In certain embodiments, it may be desirable to terminate polishing at this point (and continue with subsequent deposition and lithographic processing).

When reference level B is reached, all of the valleys 79 have been polished away and no portion of dielectric 75 has been exposed.

Further polishing may, if desired, be performed until reference line C is reached. It will be noted that when reference line C is obtained, that portions of undoped dielectric 75 is exposed. Therefore, the signal strength (which is illustratively proportional to the amount of dopant in the slurry) begins to diminish as denoted by letter C in the graph of FIG. 4. One might choose to polish to level C, i.e. to beyond the maximum signal strength of FIG. 4 if detection of the maximum is difficult or inaccurate.

Further polishing may be performed, illustratively, until line D is reached. At line D, almost all traces of doped dielectric 77 have been removed, and, as shown in FIG. 4 the corresponding signal strength has diminished to essentially noise levels.

Thus, by comparing FIGS. 3 and 4 one may obtain a dielectric with an upper polished flat surface by observing or measuring all or a portion of the curve of FIG. 4 (or derivatives of the curve of FIG. 4) produced by detector 85. Should one wish a partially planarized surface, level A may be selected. Should one wish a planarized surface with a doped overlayer, level B may be selected. Should it be desired to expose the upper portions of dielectric 75, level C may be selected. Alternatively, should one wish to remove doped overlayer 77, level D may be selected.

Figure 5:
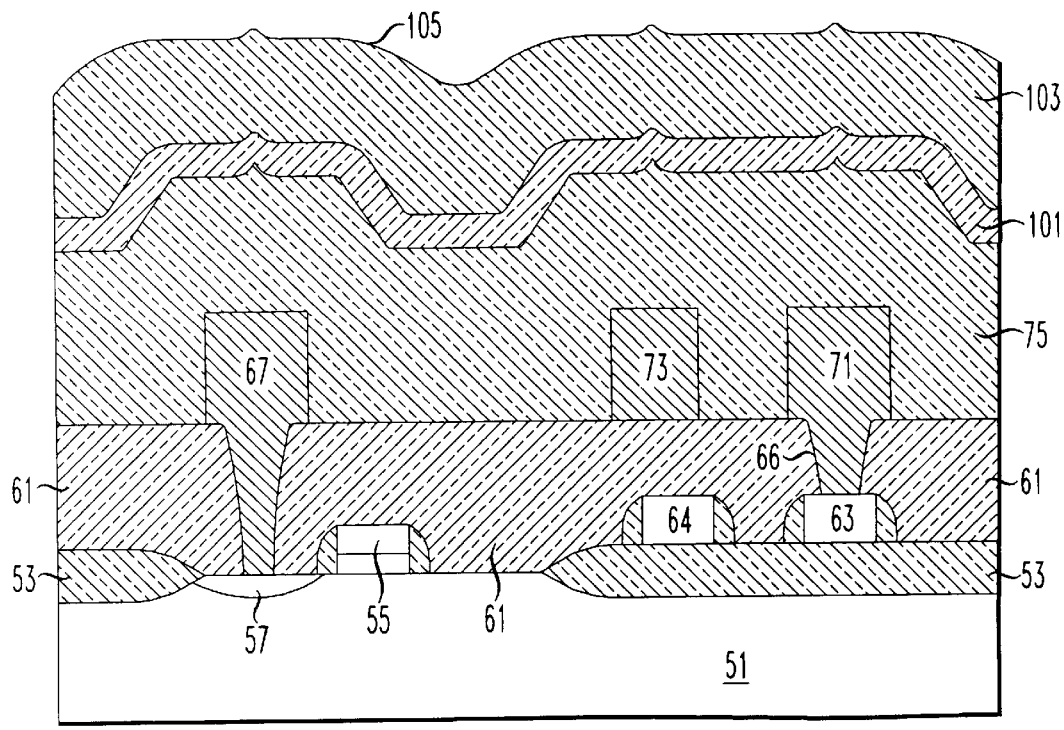
Figure 6:
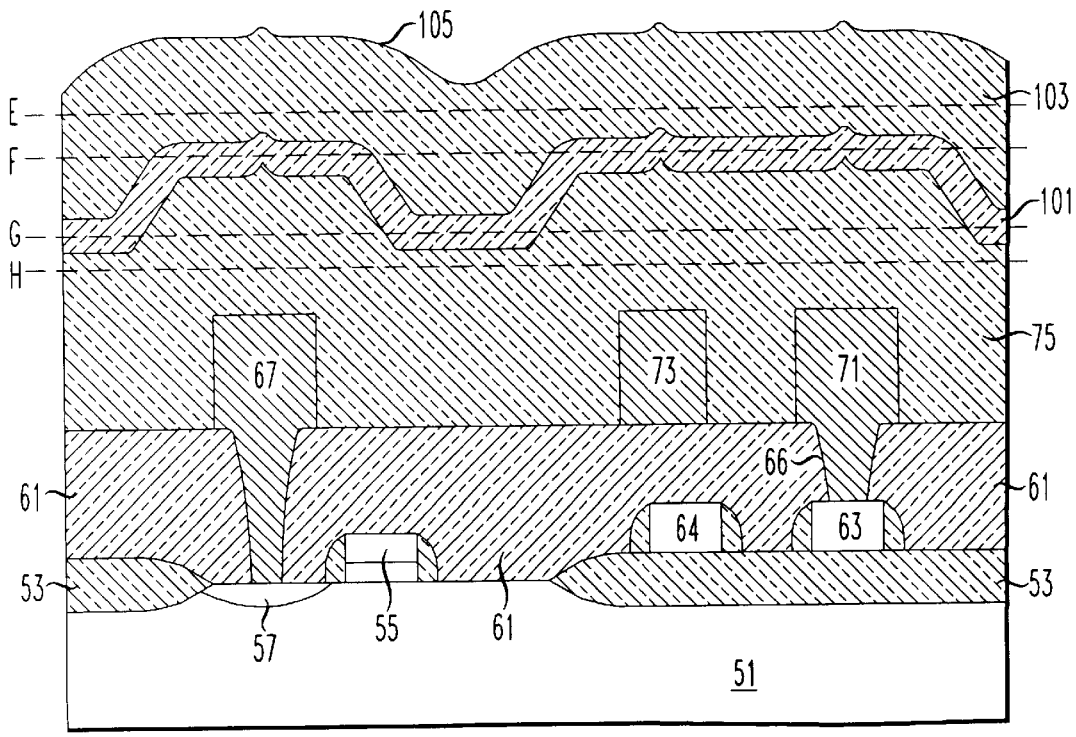
Figure 7:
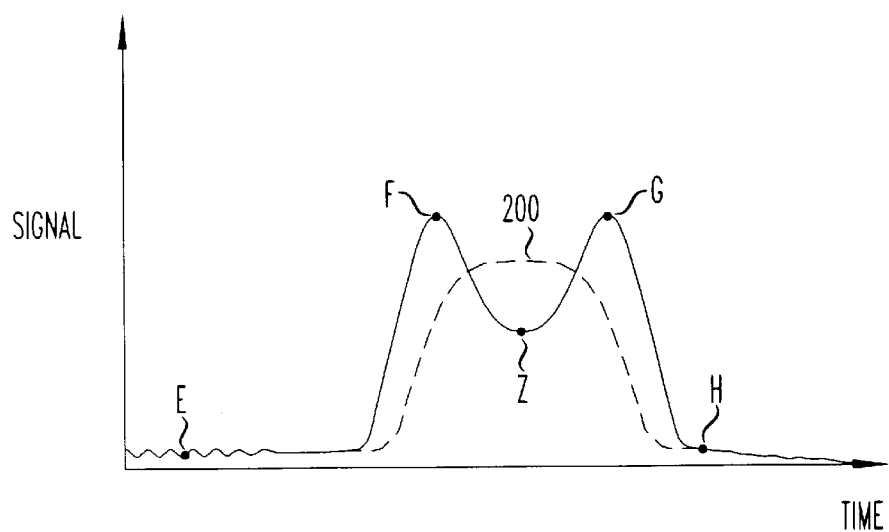

FIGS. 5, 6 and 7, taken together, illustrate another embodiment of the present invention. The cross sectional view of FIG. 5 may be compared with the cross sectional view of FIG. 2; like reference numerals refer to like components throughout. Reference numeral 75 denotes a dielectric formed above conductor 67, 73, and 71. Dielectric 75 may illustratively be an undoped oxide of silicon, possibly formed by high density plasma processes.

Reference numeral 101 denotes a doped or dyed dielectric layer formed above and in contact with dielectric layer 75. Undoped, undyed dielectric layer 103 is formed above and in contact with dielectric 101. Dielectric 101 which contains doping or dye which makes it distinguishable from dielectrics 103 and 105 may be termed a "marker layer".

Upper surface 105 of dielectric 103 is initially subjected to the polishing operation performable by the apparatus depicted in FIG. 1. As in the previous embodiment, marker layer 101 contains dopants which may be detected by mass spectrometer 85. Alternatively, the marker layer may contain dyes which may be detected by other apparatus.

Comparing the diagram of FIG. 6 with graph of FIG. 7, it will be noticed that if upper surface 105 of dielectric 103 is polished to the level denoted by letter E, then a corresponding signal observed, for example, at mass spectrometer 85 denoted by reference letter E in FIG. 7 is observed. The signal is very low, typically noise. As further polishing continues, level F in FIG. 6 is reached. An initial portion of marker layer 101 is removed and its dopant or dye detected, producing the signal denoted by letter F in FIG. 7.

As further polishing continues, a mixture of doped and undoped dielectric will be removed. Theoretically, at least one minimum, denoted by Z in FIG. 7, may be reached depending upon the irregularity of the topography of layer 101. If detector 85 does not have sufficient resolution, a curve without a minimum such as the dashed line denoted by reference numeral 200 in FIG. 7 may instead be obtained.

As further polishing continues, another theoretical maximum denoted by letter G, and corresponding to line level G in FIG. 6 is obtained. Level G is approximately midway through the lowest points of layer 101.

If further polishing is continued, virtually all of dielectric 101 is removed, as shown by the line denoted by letter H in FIG. 6. In FIG. 7, the signal strength denoted by letter H shows that the signal has deteriorated to virtually noise levels.

As mentioned before, the theoretical signal curve in FIG. 7 having the letters E, F, G, H and Z will be obtained with one or more minima, Z, if detector 85 has sufficient resolution. Otherwise, a curve similar to curve 200 having a relatively low, broad, flat peak may be obtained.

Figure 8:
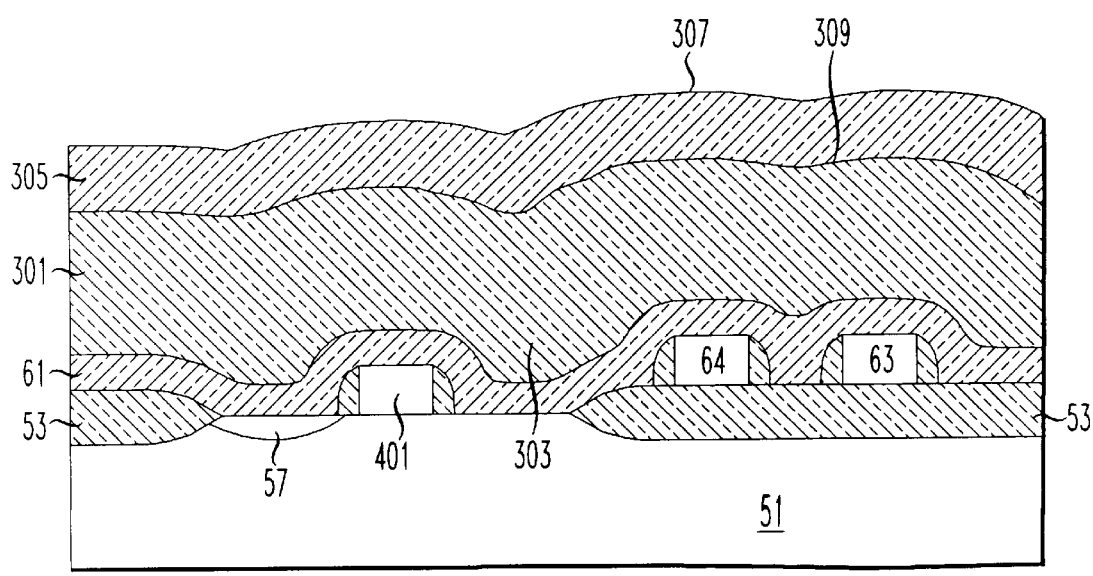
Figure 9:
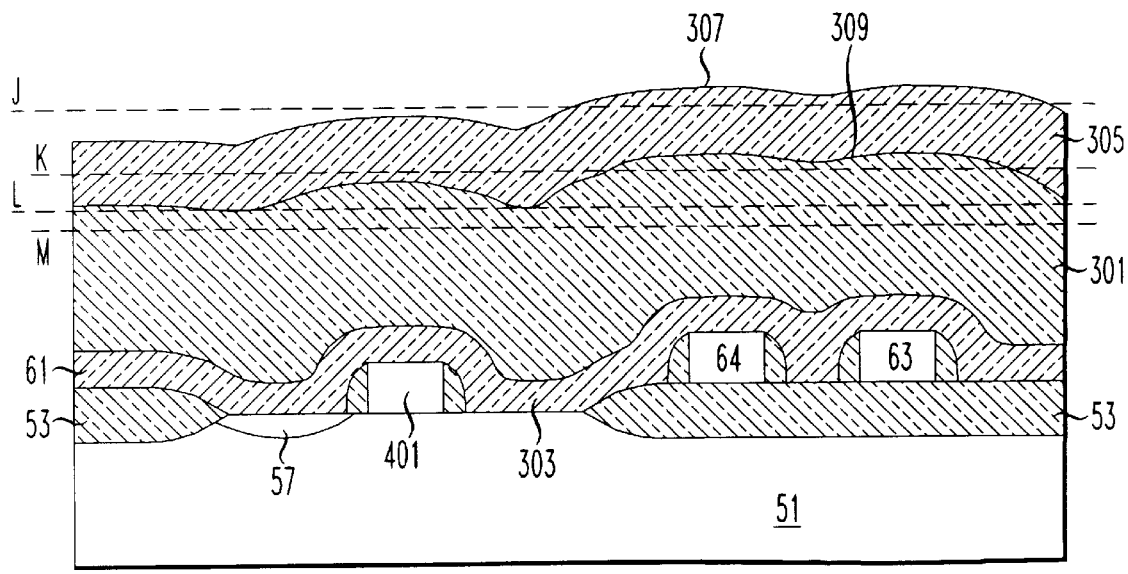
Figure 10:
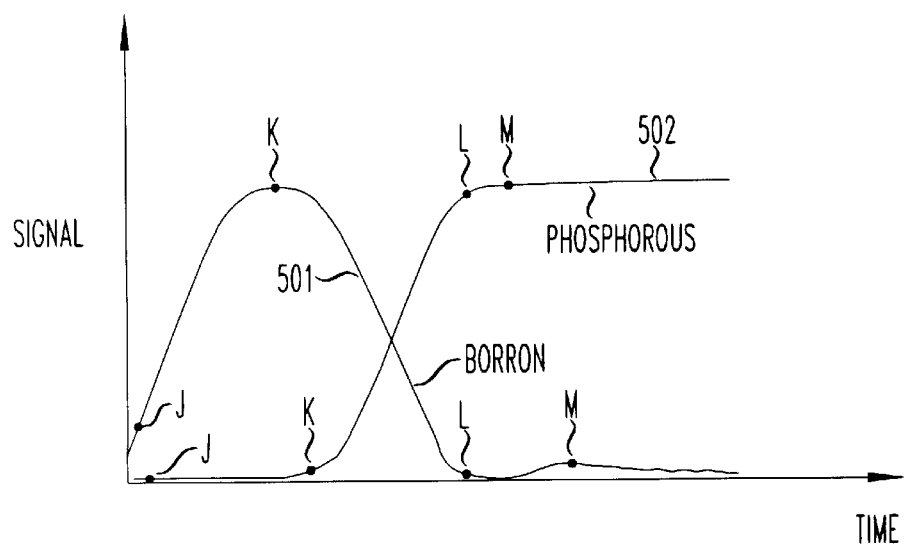

FIGS. 8, 9 and 10 illustrate another embodiment of the present invention. In FIG. 8, field oxide 53 overlies substrate 51. Also depicted are: source drain region 57 and runners 63 and 64. The first undoped (or undyed) layer 303 covers runners 63, 64 and gate 401. Dielectric 301 which covers and contacts dielectrics 303 may be illustratively doped with phosphorus. Dielectric 305 which covers and contacts dielectric 301 may illustratively be doped with boron. Thus, dielectrics 305 and 301 contain different dopants (or dyes). They may be considered sublayers of a single layer, if desired.

It will be noted, comparing FIGS. 9 and 10, that initial polishing removes portions 307 of the upper surface of boron doped layer 305. (It is assumed that one or more detectors 85 is capable of detecting phosphorus and boron.) Such as curves 501 and 502 in FIG. 10 indicating boron and phosphorus signal strength is a function of time are produced by detector 85.

It will be noted with reference to FIG. 9, that if outer surface 307 of boron doped layer 305 is removed, to a level indicated by reference line J, that a signal denoted by point J on curves 501 and 502 may be obtained by detector(s) 85. Point J on curve 501 indicates a rising signal associated with boron presence. Point J on curve 502 indicates virtually no phosphorus presence. If polishing is continued until reference line K is reached, it will be noted from FIG. 10 that point K on curve 501 represents a peak in the boron signal. Point K on curve 502 indicates initially detectable levels of phosphorus due to the polishing of upper surface 309 of layer 301. If polishing is continued until reference level L is obtained, it will be noted from FIG. 10 that point L on curve 501 indicates the substantial decrease in the boron-associated signal, point L on curve 502 indicates a peaking of the phosphorus-associated signal. If polishing is continued until reference level M is reached, the corresponding signals denoted by point M on curves 501 and 502 representing approximately steady state values of phosphorus and boron will be obtained. (The boron-associated signal is virtually noise.)

Thus, there has been disclosed, a method of CMP in which one or more layers having a detectable doped or dye (which might generally be termed a marker) is present. The presence of minute amounts of marker material is detected by a detector, which may, for example, be a mass spectrometer. If the presence of marker material is noted as a function of polishing time, one may terminate the polishing process when the desired amount of marker layer has been polished away. Observation of curves such as those depicted in FIGS. 4, 7, or 10 permit one to controllably and reliably observe the removal and rate of removal of marker material and consistently terminate the polishing operation.

The invention claimed is:

1. A method of integrated circuit manufacture comprising:

forming a material layer overlying a substrate having devices formed therein; said material layer having marker material therein;

polishing at least a portion of said material layer thereby removing some marker material;

measuring said removed marker material;

terminating said polishing after the rate of removal of said marker material reaches a predetermined quantity.

2. The method of claim 1 in which said material layer is an oxide of silicon.

3. The method of claim 1 in which said marker material is a dopant.

4. The method of claim 3 in which said dopant is chosen from the group consisting of boron and phosphorus.

5. The method of claim 1 in which said measuring is performed with an ICP mass spectrometer.

6. The method of claim 1 in which said substrate contains MOS transistors; said transistors being covered by an undoped dielectric; said material layer covering said undoped dielectric; said material layer being a doped dielectric.

7. The method of claim 6 in which a portion of said material layer is removed without achieving global planarization.

8. The method of claim 6 in which a portion of said material layer is removed; a portion of said material layer remaining, without removal of said undoped dielectric, and with achievement of global planarization.

9. The method of claim 6 in which a portion of said material layer is removed; a portion of said material layer is remaining; a portion of said undoped dielectric is removed, and global planarization is achieved.

10. The method of claim 6 in which all of said material layer is removed and global planarization is achieved.

11. The method of claim 6 in which said doped dielectric is covered by a second undoped dielectric.

12. The method of claim 11 in which a portion of said undoped dielectric is removed and global planarization is not achieved.

13. The method of claim 11 in which a portion of said material layer is removed and global planarization is achieved.

14. The method of claim 11 in which a portion of said material layer is removed and a portion of said first dielectric is removed and global planarization is achieved.

15. The method of claim 11 in which all of said material layer is removed and global planarization is achieved.

16. The method of claim 1 in which said material layer is a bi-layer, having first and second sublayer, said first and second sublayers each having a different marker and in which the removed marker material from either first or second sublayer or both is measured.

* * * * *